(12) United States Patent
Kim et al.

(10) Patent No.: US 8,861,278 B2
(45) Date of Patent: Oct. 14, 2014

(54) NON-VOLATILE MEMORY DEVICE AND CACHE PROGRAM METHOD OF THE SAME

(75) Inventors: You-Sung Kim, Gyeonggi-do (KR); Se-Chun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 353 days.

(21) Appl. No.: 13/291,359

(22) Filed: Nov. 8, 2011

(65) Prior Publication Data

US 2012/0155182 A1    Jun. 21, 2012

(30) Foreign Application Priority Data

Dec. 21, 2010  (KR) .......................... 10-2010-0131395

(51) Int. Cl.
| | | |
|---|---|---|
| G11C 16/00 | (2006.01) | |
| G11C 16/02 | (2006.01) | |
| G11C 16/04 | (2006.01) | |
| G11C 16/06 | (2006.01) | |
| G11C 16/34 | (2006.01) | |
| G11C 16/10 | (2006.01) | |
| G11C 11/56 | (2006.01) | |

(52) U.S. Cl.
CPC ........ *G11C 11/5628* (2013.01); *G11C 16/3418* (2013.01); *G11C 16/3454* (2013.01); *G11C 16/10* (2013.01)
USPC ............ 365/185.19; 365/185.18; 365/185.08; 365/185.22; 365/185.24

(58) Field of Classification Search
CPC ........ G11C 16/00; G11C 16/02; G11C 16/04; G11C 16/06; G11C 16/34; G11C 16/3404; G11C 16/3436; G11C 16/3454; G11C 16/3459; G11C 16/3468; G11C 16/3481; G11C 2216/12
USPC ............ 365/185.08, 185.18, 185.19, 185.22, 365/185.24
See application file for complete search history.

(56) References Cited

U.S. PATENT DOCUMENTS

| | | | |
|---|---|---|---|
| 2006/0245247 A1* | 11/2006 | Yano et al. ................ | 365/185.08 |
| 2008/0002468 A1* | 1/2008 | Hemink ..................... | 365/185.17 |
| 2008/0043535 A1* | 2/2008 | Roohparvar ............. | 365/185.19 |
| 2008/0235451 A1* | 9/2008 | Chae ............................. | 711/118 |

FOREIGN PATENT DOCUMENTS

| | | |
|---|---|---|
| KR | 1020070122208 | 12/2007 |
| KR | 1020090077318 | 7/2009 |
| KR | 1020110078734 | 7/2011 |

OTHER PUBLICATIONS

Notice of Allowance issued by the Korean Intellectual Property Office on Nov. 29, 2012.
Office Action issued by the Korean Intellectual Property Office on Mar. 28, 2012.

* cited by examiner

*Primary Examiner* — J. H. Hur
(74) *Attorney, Agent, or Firm* — IP & T Group LLP

(57) ABSTRACT

A cache programming method for a non-volatile memory device includes programming data for a current programming operation into a memory cell array, determining whether the current programming operation has been performed to a threshold point of program completion, and receiving a data for a next programming operation when the current programming operation has been performed to the threshold point of program completion.

14 Claims, 7 Drawing Sheets

NON-VOLATILE MEMORY DEVICE AND CACHE PROGRAM METHOD OF THE SAME

CROSS-REFERENCE TO RELATED APPLICATIONS

The present application claims priority of Korean Patent Application No. 10-2010-0131395, filed on Dec. 21, 2010, which is incorporated herein by reference in its entirety.

BACKGROUND OF THE INVENTION

Exemplary embodiments of the present invention relate to a non-volatile memory device, and more particularly, to a cache programming operation of a non-volatile memory device.

Memory devices are divided into volatile memory devices and non-volatile memory devices according to whether data is retained or not when a power source is cut off. Volatile memory devices lose data when power is cut off, where Dynamic Random Access Memory (DRAM) devices and Static Random Access Memory (SRAM) devices are exemplary volatile memory devices. On the other hand, non-volatile memory devices retain data stored therein although power is cut off, where flash memory devices are exemplary non-volatile memory devices.

Flash memory devices may use a cache programming method to increase a programming rate. According to the cache programming method, while a programming operation is performed, the data for the next programming operation is received and stored in a register (for example, an available latch of a page buffer) in advance and after the current programming operation is completed, the data for the next programming operation which has been stored in the register is programmed successively.

Since the data for the next programming operation should be received during the current programming operation, the current peak of the cache programming operation increases. Moreover, when the current peak exceeds the amount of current that may be supplied by a system that uses a non-volatile memory device, instable operation or operation failure may occur. Therefore, a technology that prevents the current peak from increasing during a cache programming operation is useful.

SUMMARY OF THE INVENTION

An embodiment of the present invention is directed to a cache programming method that may prevent a current peak from increasing during a cache programming operation.

In accordance with an embodiment of the present invention, a cache programming method for a non-volatile memory device includes: programming data for a current programming operation into a memory cell array; determining whether the current programming operation has been performed to a threshold point of program completion; and receiving a data for a next programming operation when the current programming operation has been performed to the threshold point of program completion.

In accordance with another embodiment of the present invention, a non-volatile memory device includes: a cell array including a plurality of memory cells; a first register and a second register configured to store data for a current programming operation and data for a next programming operation; and a controller configured to store the data for the next programming operation after the current programming operation is performed to a threshold point of program completion.

DESCRIPTION OF SPECIFIC EMBODIMENTS

Figure 1:
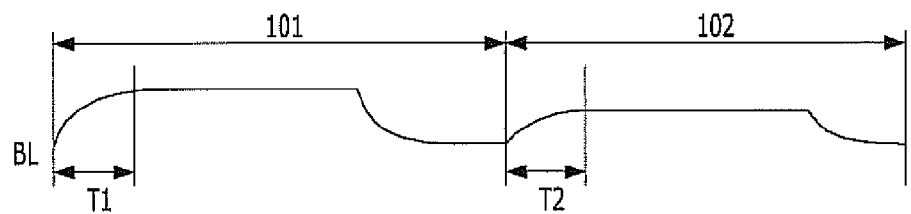
FIG. 1 illustrates a voltage level displacement of a bit line in a program pulse duration where a program pulse is applied and a program verification duration where a verification operation is performed for a programming operation of a non-volatile memory device during the programming operation.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 illustrates a voltage level displacement of a bit line in a program pulse duration where a program pulse is applied and a program verification duration where a verification operation is performed for a programming operation of a non-volatile memory device during the programming operation.

A programming operation of a non-volatile memory device is largely divided into a program pulse duration 101 and a program verification duration 102. During the program pulse duration 101, a current peak appears in a bit line loading duration T1, which is for setting up and recovering a bit line, and a pumping duration (not shown). The current peak of the bit line loading duration T1 may be detected based on an equation of $I=C*\Delta V/T$ when the capacitance of the bit line (CBL1: a sum of a capacitance due to the cross-coupling between bit lines when a program pulse is applied and the intrinsic capacitance of a bit line) in the bit line loading duration T1 is known and a voltage variation ($\Delta$VBL1) of the bit line in the bit line loading duration T1 is known. In short, the current peak I1. of the program pulse duration 101 may be represented by:

$$I1=CBL1*\Delta VBL1/T1 \qquad \text{Equation 1}$$

Based on the same principle, the current peak I2 of the program verification duration 102 may be represented by:

$$I2=CBL2*\Delta VBL2/T2 \qquad \text{Equation 2}$$

where CBL2 denotes the sum of a capacitance due to the cross-coupling between bit lines when a pre-charge operation (T2) is performed and the intrinsic capacitance of a bit line; and $\Delta$VBL2 denotes the voltage variation of the bit line during the pre-charge operation (T2).

As shown in FIG. 1, since the voltage variation ($\Delta$VBL1) of the bit line loading duration T1 is greater than the voltage variation $\Delta$VBL2 of the bit line during the pre-charge operation duration T2, greatest current peaks in the programming operation of the non-volatile memory device appear during the bit line loading duration T1.

The capacitance of the bit line (CBL1) during the bit line loading duration T1 is closely related to the number of memory cells to be programmed. In the initial stage of a programming operation, a great number of memory cells are to be programmed. Therefore, the capacitance of the bit line CBL1 is large. However, as the remaining number of memory cells to be programmed decreases and the number of program-inhibited memory cells increase while the programming operation is repeatedly performed, the capacitance of the bit line CRL1 decreases.

Figure 2:
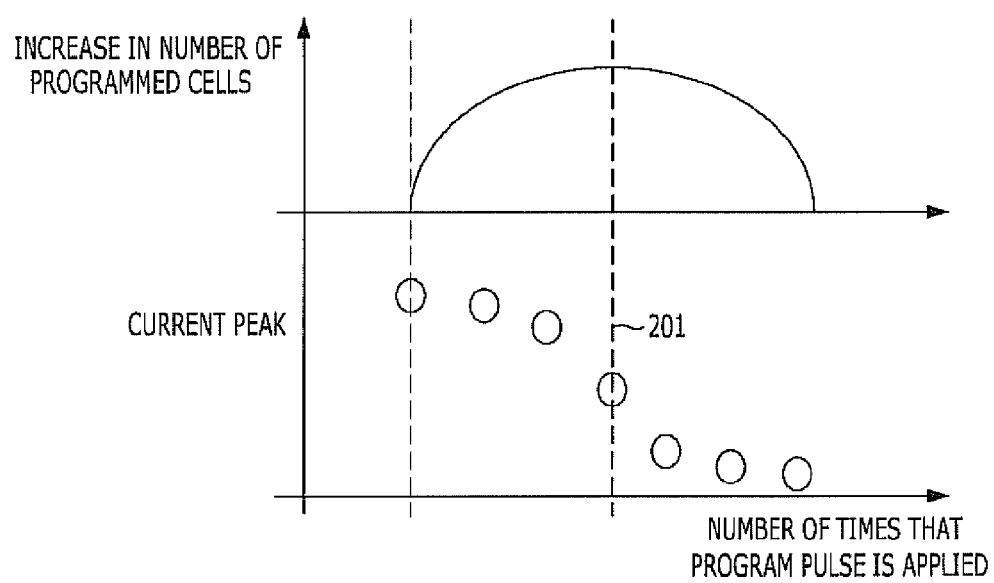
FIG. 2 is a graph showing increase in the number of programmed memory cells and variation of current peak when a program pulse is repeatedly applied during a programming operation.

FIG. 2 is a graph showing the increase in the number of the programmed memory cells and variation of current peak when a program pulse is repeatedly applied during a programming operation.

Referring to the upper part of FIG. 2, when a program pulse is applied for the first time, a small number of memory cells are programmed by the program pulse, but the number of memory cells programmed by the program pulse (that is, the increase in the number of programmed memory cells) becomes progressively larger in response to subsequent program pulses. Then, after reaching a peak for the increase in the number of programmed cells, the increase becomes progressively smaller in response to program pulses. In short, the increase in the number of programmed memory cells may be described with a Gaussian distribution in which the increase in the number of programmed memory cells becomes progressively larger and after reaching a peak, becomes progressively smaller as program pulses are applied.

Referring to the lower part of FIG. 2, since the number of memory cells that are yet to be programmed is large in the initial stage of the programming operation (that is, when the total number of program pulses that have been applied is relatively small), the current peak is high. However, as the programming operation proceeds, the current peak is lowered progressively. Particularly, the current peak drastically decreases at about point 201 where the increase in the number of programmed memory cells is largest, for example, in response to an application of a program pulse.

As described before, the current peak progressively decreases as the programming operation proceeds. Here, if the timing of when data (for example, cache data) for the next programming operation is received and stored is controlled during the current cache programming operation, the current peak may be prevented from being increased due to the cache programming operation as described in detail below.

Figure 3:
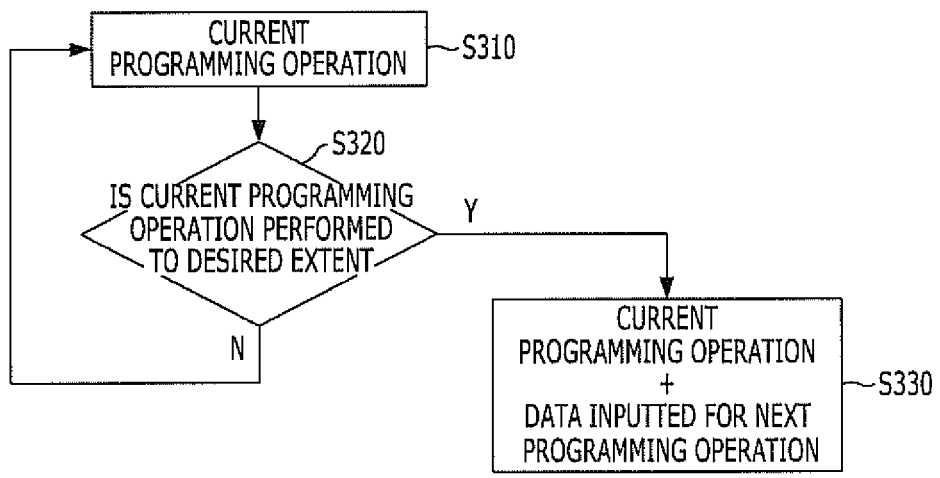
FIG. 3 is a flowchart describing a cache programming method of a non-volatile memory device in accordance with a general embodiment of the present invention.

FIG. 3 is a flowchart describing a cache programming method of a non-volatile memory device in accordance with an embodiment of the present invention.

Referring to FIG. 3, data for a current programming operation is programmed in a memory cell array in step S310.

During the current programming operation for the memory cell array, it is checked in step S320 whether the current programming operation is performed to least a threshold point of program completion. The current programming operation of the step S310 is performed in such a manner that a program pulse is applied for several times. The checking process of the step S320 may be performed each time that the program pulse is applied, or it may be performed periodically at a predetermined period while the current programming operation of the step S310 is performed. In the step S320, a determination as to whether the current programming operation has been performed more than the threshold point of program completion or not may be made based on whether a current peak is sufficiently decreased or not. For example, when the determination is made before a point of time corresponding to point 201 in FIG. 2, it may be decided that the programming operation has not been performed to the threshold point of program completion. After a time corresponding to point 201 in FIG. 2, however, it may be decided that the programming operation has been performed to at least the threshold point of program completion. The criteria for determining whether a programming operation has been performed to at least the threshold point of program completion will be described later in detail.

When it is decided that the current programming operation has not been performed to the threshold point of program completion as a result of the checking process of the step S320 (that is, when it is decided that the current peak has not decreased sufficiently), the programming process of the step S310 where the data for the current programming operation is programmed in the memory cell array is repeated. Here, step S320 is performed repeatedly at a periodic cycle during the programming process of the step S310 to determine if the current programming operation has been performed to the threshold point of program completion.

When it is decided that has been performed to the threshold point of program completion as a result of step S320 (that is, when it is decided that the current peak is decreased sufficiently), data for the next programming operation is inputted during the performance of the current programming operation. Thus, the current programming operation and receipt of the data for the next programming operation are performed simultaneously in step S330. After the process of the step S330 is completed (that is, when the current programming operation is completed and the data for the next programming operation is inputted), the data inputted in the step S330 is programmed (not shown).

Here, the data for the next programming operation may be received in the step S330 in response to enabled cache ready signal CACHE RB# (shown in FIG. 9) of a non-volatile memory device. The cache ready signal CACHE RB# is a flag signal that a non-volatile memory device transfers to a memory controller. The enabled cache ready signal CACHE RB# indicates that the non-volatile memory device is ready to receive the data for the next programming operation. On the other hand, disabled cache ready signal CACHE RB# indicates that the programming operation is not ready to receive the data for the next programming operation.

Figure 4:
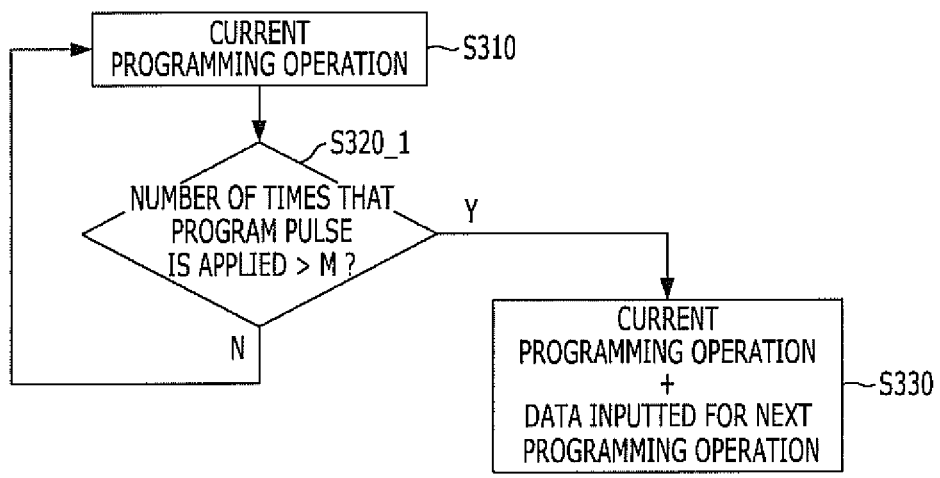
FIG. 4 is a flowchart describing a cache programming method of a non-volatile memory device in accordance with a first embodiment of the present invention.

FIG. 4 is a flowchart describing a cache programming method of a non-volatile memory device in accordance with a first embodiment of the present invention.

Referring to FIG. 4, a specific example of the step S320 is shown, where a determination is made as to whether the number of times that the program pulse is applied exceeds a predetermined number M or not, at step S320_1. The current programming operation is performed as the program pulse is applied to a selected word line for multiple times. Here, a determination of the extent of the programming operation is made based on the number of times that the program pulse has been applied.

The number M may be decided based on the point of time when the amount of current consumption decreases considerably. For example, when it is assumed that a program pulse is applied 10 times on average until a programming operation is completed and the amount of current consumption by the programming operation decreases after the program pulse has been applied for seven times, the predetermined number of times M may be set to equal 7. In this case, data for the next programming operation is inputted after the program pulse has been applied for 7 times.

Figure 5:
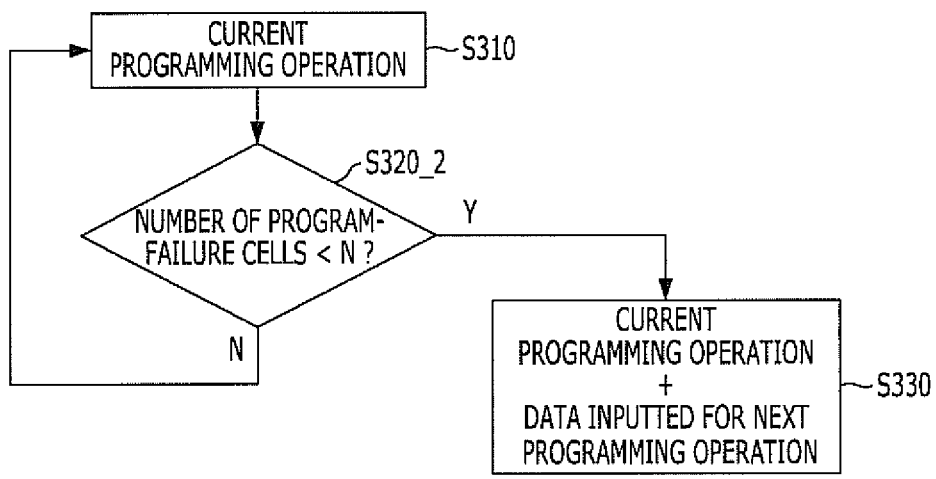
FIG. 5 is a flowchart describing a cache programming method of a non-volatile memory device in accordance with a second embodiment of the present invention.

FIG. 5 is a flowchart describing a cache programming method of a non-volatile memory device in accordance with a second embodiment of the present invention.

Referring to FIG. 5, another specific example of the step S320 is shown, where a determination is made as to whether the number of program-fail memory cells is less than a designated number N or not at step S320_2. As the programming operation is progressively performed, the number of program-fail cells decreases. Here, a determination of the extent of the programming operation is made based on the number of program-fail cells.

The number N may be decided based on the point of time when the amount of current consumption decreases considerably. For example, assuming that there are 4000 memory cells in one page, which may be a unit of memory cells for a programming operation, and the amount of current consumption by the programming operation considerably decreases after the number of program-fail cells is decreased to less than 1000, the number N may be set to 1000. In this case, data for the next programming operation is inputted after the number of programming-failure cells has decreased to less than 1000.

Figure 6:
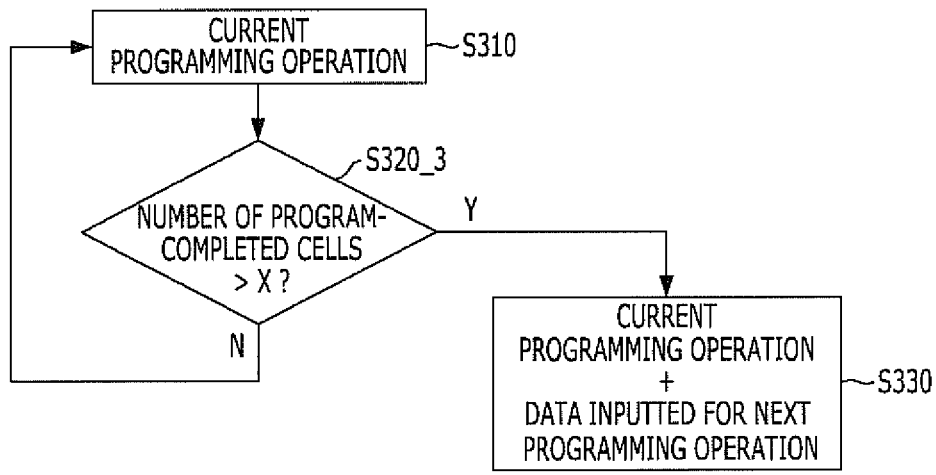
FIG. 6 is a flowchart describing a cache programming method of a non-volatile memory device in accordance with a third embodiment of the present invention.

FIG. 6 is a flowchart describing a cache programming method of a non-volatile memory device in accordance with a third embodiment of the present invention.

Referring to FIG. 6, another specific example of the step S320 is shown, where a determination is made as to whether the number of program-completed memory cells exceeds a designated number X or not at step S320_3. As the programming operation is progressively performed, the number of program-completed cells increases. Here, a determination of the extent of the programming operation is made based on the number of program-completed cells.

The number X may be decided based on the point of time when the amount of current consumption considerably decreases. For example, assuming that there are 4000 memory cells in one page and the amount of current consumption by the programming operation decreases after the number of programming-completed cells is increased to more than 3000, the number X may be set to 3000. In this case, data for the next programming operation is inputted after the number of programming-completed cells has increased to more than 3000.

Figure 7:
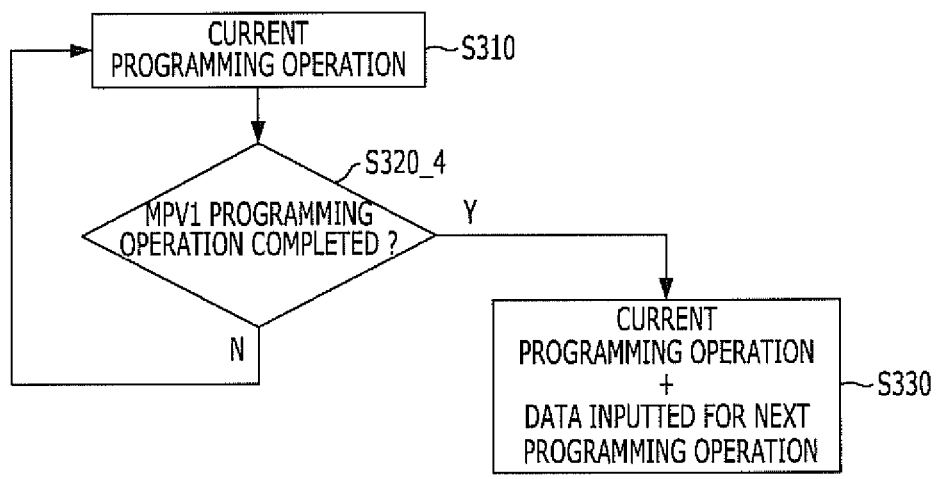
FIG. 7 is a flowchart describing a cache programming method of a non-volatile memory device in accordance with a fourth embodiment of the present invention.
Figure 8:
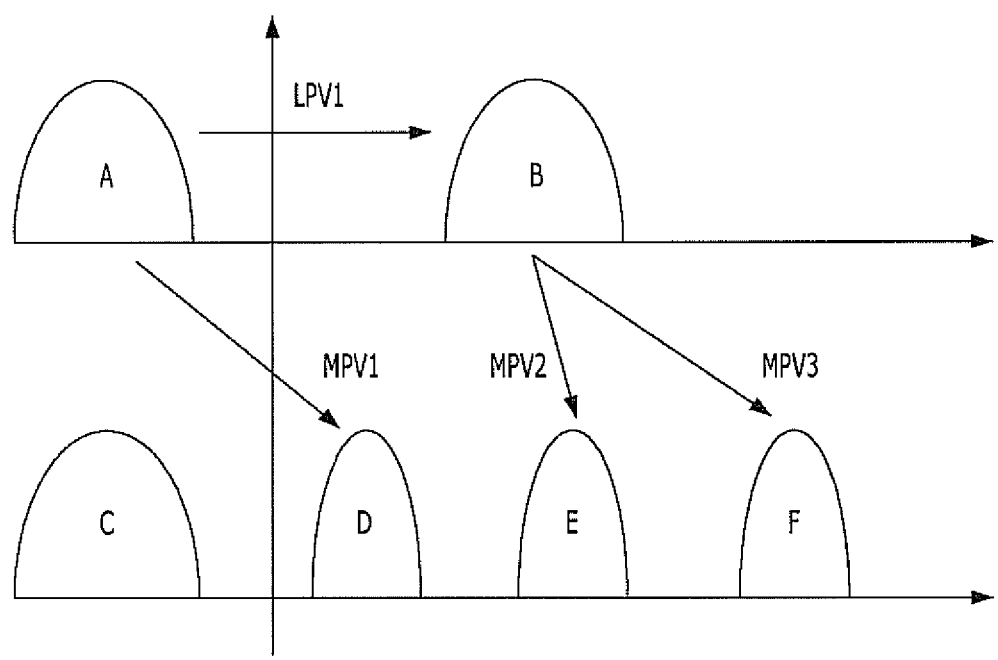
FIG. 8 shows a distribution of threshold voltages A and B in a Least Significant Bit (LSB) programming operation based on Multi-Level Cell (MLC) and a distribution of threshold voltages C, D, E and F in a Most Significant Bit (MSB) programming operation.

FIG. 7 is a flowchart describing a cache programming method of a non-volatile memory device in accordance with a fourth embodiment of the present invention. FIG. 8 shows a distribution of threshold voltages A and B in a Least Significant Bit (LSB) programming operation for Multi-Level Cell (MLC) and a distribution of threshold voltages C, D, E and F in a Most Significant Bit (MSB) programming operation.

The cache programming method described with reference to FIGS. 3 to 6 may be applied to both Single Level Cell (SLC) programming methods and Multi-Level Cell (MLC) programming methods. Also, among the MLC programming methods, the cache programming method may be applied to a Least Significant Bit (LSB) programming method and a Most Significant Bit (MSB) programming method. In short, the cache programming method described with reference to FIGS. 3 to 6 may be applied to all cache programming methods.

Referring to FIG. 7, a cache programming method that may be applied to an exemplary MSB programming method is described.

In FIG. 7, a process of checking whether a programming operation (for example, an MPV1 programming operation) for at least one target threshold voltage level D among a plurality of target threshold voltage levels D, E and F of the MSB programming method is completed or not is performed at step S320_4. When the MSB programming operation is performed, the MPV1 programming operation is completed first for a first target threshold voltage level and then an MPV2 programming operation for a second target threshold voltage level and an MPV3 programming operation for a third target threshold voltage level are completed. Therefore, when the MPV1 programming operation is completed, it may be seen that the programming operation has been performed to the threshold point of program completion.

Although FIG. 7 illustrates a case where a data for the next programming operation is inputted after the MPV1 programming operation is completed, it is exemplary only and it is also possible to design a system in other manners such as a system designed for inputting the data for the next programming operation after the MPV2 programming operation is completed.

Figure 9:
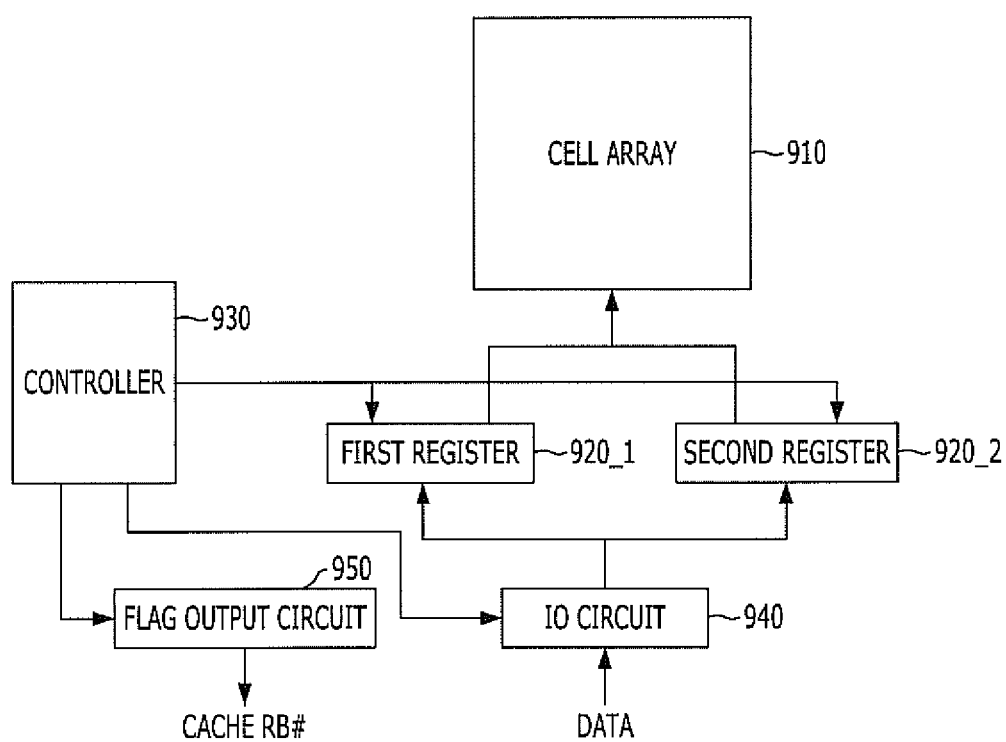
FIG. 9 is a block view of a non-volatile memory device in accordance with an embodiment of the present invention.

FIG. 9 is a block view of a non-volatile memory device in accordance with an embodiment of the present invention.

Referring to FIG. 9, the non-volatile memory device includes: a cell array 910 including a plurality of memory cells; a first register 920_1 and a second register 920_2 configured to store a data for a current programming operation and a data for a next programming operation; a controller 930 configured to store the data for the next programming operation after the current programming operation is performed to threshold point of program completion; an input/output (IO) circuit 940 configured to input/output a data; and a flag output circuit 950 configured to output a cache ready signal CACHE RB#.

The first register 920_1 and the second register 920_2 store the data for the current programming operation and the data for the next programming operation. For example, when the first register 920_1 stores the data for the current programming operation, the second register 920_2 stores the data for the next programming operation. According to another example, when the second register 920_2 stores the data for the current programming operation, the first register 920_1 stores the data for the next programming operation. In other words, when the data for the current programming operation is stored in any one register between the first register 920_1 and the second register 920_2, and the data for the next programming operation may be stored in the other register.

The controller 930 checks how much the current programming operation where the data for the current programming operation is stored in any one register between the first register 920_1 and the second register 920_2 (e.g., the first register 920_1) and is programmed in the cell array 910 has progressed, and when the current programming operation has progressed to at least the threshold point of program completion, the controller 930 enables the cache ready signal CACHE RB# to be outputted to the flag output circuit 950 so that the data for the next programming operation could be stored in the other register (e.g., the second register 920_2). Whether the current programming operation has been performed to the threshold point of program completion may be decided based on the methods described above with reference to FIGS. 4 to 7.

When the cache ready signal CACHE RB# is enabled, the data for the next programming operation, which is a cache data, is inputted to the non-volatile memory device through the IO circuit 940, and the inputted data is stored in the register (e.g., second register 920_2).

Figure 10:
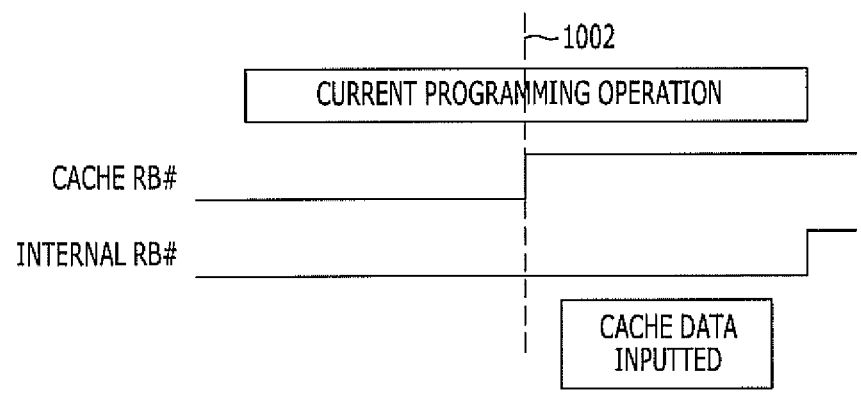
FIG. 10 is a timing diagram illustrating an operation of a non-volatile memory device in accordance with an embodiment of the present invention.

FIG. 10 is a timing diagram illustrating an operation of a non-volatile memory device in accordance with an embodiment of the present invention.

Referring to FIG. 10, the data for the current programming operation is programmed into the cell array 910. When the current programming operation has progressed to a threshold point of program completion (that is, when the current programming operation passes point 1002), the cache ready signal CACHE RB# is enabled and then the data for the next programming operation, which is a cache data, is inputted through the IO circuit 940 and stored in a register.

'INTERNAL RB#' shown in FIG. 10 is an internal busy signal. During a duration where the internal busy signal INTERNAL RB# is in a logic low level, the non-volatile memory device performs a programming operation, and during a duration where the internal busy signal INTERNAL RB# is in a logic high level, the non-volatile memory device does not perform a programming operation.

When the time between the moment when the cache ready signal CACHE RB# is enabled and the moment when the internal busy signal INTERNAL RB# is enabled is longer than a time taken for the data for the next programming operation is inputted (which is a data-in time), current peak may be decreased while not affecting the performance of the cache programming operation.

According to the technology of the present invention, a data for a next program is inputted after a current programming operation is performed to a threshold point of program completion. Therefore, the data for the next program is inputted during a duration of the current programming operation where current is not consumed greatly. As a result, a current peak may be prevented from increasing during a cache programming operation.

While the present invention has been described with respect to the specific embodiments, it will be apparent to those skilled in the art that various changes and modifications may be made without departing from the spirit and scope of the invention as defined in the following claims.

What is claimed is:

1. A cache programming method for a non-volatile memory device, comprising:
    programming data for a current programming operation into a memory cell array;
    determining whether the current programming operation has been performed to a threshold point of program completion; and
    receiving a data for a next programming operation when the current programming operation has been performed to the threshold point of program completion,
    wherein after the threshold point of program completion, the increases in numbers of programmed memory cells progressively decrease in response to applications of respective program pulses during the current programming operation.

2. The cache programming method of claim 1, wherein the determination of whether the current programming operation has been performed to the threshold point of program completion is performed by detecting a number of times that a program pulse has been repeatedly applied.

3. The cache programming method of claim 1, wherein the determination of whether the current programming operation has been performed to the threshold point of program completion is performed by detecting a number of program-fail cells.

4. The cache programming method of claim 1, wherein the determination of whether the current programming operation has been performed to the threshold point of program completion is performed by detecting a number of program-completed cells.

5. The cache programming method of claim 1, wherein the current programming operation is a most significant bit (MSB) programming operation, and
    the determination as to whether the current programming operation has been performed to the threshold point of program completion is performed by determining whether a programming operation for at least one target threshold voltage level among a plurality of target threshold voltage levels of the MSB programming operation has been completed or not.

6. The cache programming method of claim 1, wherein when the programming operation is performed to the threshold point of program completion, a cache ready signal is enabled to input the data for the next programming operation.

7. The cache programming method of claim 1, wherein while the data for the next programming operation is inputted, the data for the current programming operation is programmed into the memory cell array until the current programming operation is completed.

8. A cache programming method for a non-volatile memory device, comprising:
    programming data for a current programming operation into a memory cell array;
    determining whether the current programming operation has been performed to a threshold point of program completion; and
    receiving a data for a next programming operation when the current programming operation has been performed to the threshold point of program completion,
    wherein the threshold point of program completion is a point where an increase in a number of programmed memory cells is the largest in response to an application of a program pulse applied during the current programming operation among increases in numbers of programmed memory cells in response to applications of respective program pulses during the current programming operation.

9. A non-volatile memory device, comprising:
    a cell array including a plurality of memory cells;
    a first register and a second register configured to store data for a current programming operation and data for a next programming operation; and
    a controller configured to store the data for the next programming operation after the current programming operation is performed to a threshold point of program completion, wherein after the threshold point of program completion, the increases in numbers of programmed memory cells progressively decrease in response to applications of respective program pulses during the current programming operation.

10. The non-volatile memory device of claim 9, wherein the controller is configured to enable a cache ready signal after the current programming operation has been performed to the threshold point of program completion.

11. The non-volatile memory device of claim 9, wherein the controller is configured to determine whether the current programming operation has been performed to the threshold point of program completion by determining the number of times that a program pulse has been applied.

12. The non-volatile memory device of claim 9, wherein the controller is configured to determine whether the current programming operation has been performed to at least the threshold point of program completion by determining a number of program-fail cells.

13. The non-volatile memory device of claim 9, wherein the controller is configured to decide whether the current programming operation has been performed to the threshold point of program completion by determining a number of program-completed cells.

14. The non-volatile memory device of claim 9, wherein the current programming operation is a most significant bit (MSB) programming operation, and
the controller is configured to determine whether the current programming operation has been performed to the threshold point of program completion by determining whether a programming operation for at least one target level among a plurality of target levels of the MSB programming operation has been completed or not.

* * * * *